(12) United States Patent
Hampp et al.

(10) Patent No.: US 9,006,898 B2
(45) Date of Patent: Apr. 14, 2015

(54) CONDUCTIVE LINES AND PADS AND METHOD OF MANUFACTURING THEREOF

(71) Applicant: Infineon Technologies AG, Neubiberg (DE)

(72) Inventors: Roland Hampp, Bad Abbach (DE); Thomas Fischer, Regensburg (DE); Uwe Hoeckele, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/060,734

(22) Filed: Oct. 23, 2013

(65) Prior Publication Data

US 2014/0048940 A1  Feb. 20, 2014

Related U.S. Application Data

(62) Division of application No. 12/836,151, filed on Jul. 14, 2010, now Pat. No. 8,586,472.

(51) Int. Cl.
*H01L 23/48* (2006.01)
*H01L 23/52* (2006.01)
(Continued)

(52) U.S. Cl.
CPC ............. *H01L 23/498* (2013.01); *H01L 24/03* (2013.01); *H01L 24/05* (2013.01); *H01L 24/06* (2013.01); *H01L 21/76838* (2013.01); *H01L 22/32* (2013.01); *H01L 2224/03462* (2013.01); *H01L 2224/03464* (2013.01); *H01L 2224/0347* (2013.01); *H01L 2224/03903* (2013.01); *H01L 2224/04042* (2013.01); *H01L 2224/05073* (2013.01); *H01L 2224/05082* (2013.01); *H01L 2224/051* (2013.01); *H01L 2224/05155* (2013.01); *H01L 2224/05157* (2013.01); *H01L 2224/05164* (2013.01); *H01L 2224/05187* (2013.01); *H01L 2224/05562* (2013.01); *H01L 2224/05568* (2013.01); *H01L 2224/05572* (2013.01); *H01L 2224/05582* (2013.01); *H01L 2224/05583* (2013.01); *H01L 2224/056* (2013.01); *H01L 2224/05644* (2013.01); *H01L 2224/05655* (2013.01); *H01L 2224/05657* (2013.01); *H01L 2224/05664* (2013.01); *H01L 2224/06051* (2013.01); *H01L 2224/06102* (2013.01); *H01L 2224/06505* (2013.01); *H01L 2224/06515* (2013.01); *H01L 2924/01013* (2013.01); *H01L 2924/01025* (2013.01); *H01L 2924/01029* (2013.01); *H01L 2924/0103* (2013.01); *H01L 2924/01032* (2013.01);
(Continued)

(58) Field of Classification Search
USPC .................................................. 257/750–766
See application file for complete search history.

(56) References Cited

U.S. PATENT DOCUMENTS

4,109,372 A   8/1978 Geffken
5,451,810 A   9/1995 Tigelaar et al.
(Continued)

*Primary Examiner* — Ngan Ngo
(74) *Attorney, Agent, or Firm* — Slater & Matsil, L.L.P.

(57) ABSTRACT

A semiconductor device and method are disclosed. The semiconductor device includes a substrate having a first region and a second region and an insulating layer arranged on the substrate. A first conductive layer is arranged in or on insulating layer in the first region and a second conductive layer is arranged in or on the insulating layer in the second region. The first conductive layer comprises a first conductive material and the second conductive layer comprises a second conductive material wherein the first conductive material is different than the second conductive material. A metal layer is arranged on the first conductive layer.

9 Claims, 5 Drawing Sheets

(51) Int. Cl.
  *H01L 23/498* (2006.01)
  *H01L 23/00* (2006.01)
  *H01L 21/768* (2006.01)
  *H01L 21/66* (2006.01)

(52) U.S. Cl.
  CPC ............... *H01L2924/01047* (2013.01); *H01L 2924/01049* (2013.01); *H01L 2924/01073* (2013.01); *H01L 2924/01079* (2013.01); *H01L 2924/01082* (2013.01); *H01L 2924/01005* (2013.01); *H01L 2924/01006* (2013.01); *H01L 2924/01019* (2013.01); *H01L 2924/01024* (2013.01); *H01L 2924/01033* (2013.01); *H01L 2924/0104* (2013.01); *H01L 2924/01042* (2013.01); *H01L 2924/01045* (2013.01); *H01L 2924/0105* (2013.01); *H01L 2924/01072* (2013.01); *H01L 2924/01074* (2013.01); *H01L 2924/01075* (2013.01); *H01L 2924/01078* (2013.01)

(56) References Cited

U.S. PATENT DOCUMENTS

| | | | |
|---|---|---|---|
| 6,130,449 A | 10/2000 | Matsuoka et al. | |
| 6,147,408 A | 11/2000 | Ogure et al. | |
| 6,175,145 B1 | 1/2001 | Lee et al. | |
| 6,376,888 B1 | 4/2002 | Tsunashima et al. | |
| 6,426,558 B1 | 7/2002 | Chapple-Sokol et al. | |
| 6,617,689 B1* | 9/2003 | Honeycutt | 257/750 |
| 6,734,483 B2* | 5/2004 | Morand et al. | 257/301 |
| 6,787,458 B1 | 9/2004 | Tripsas et al. | |
| 6,919,617 B2* | 7/2005 | Yamada et al. | 257/635 |
| 7,507,996 B2* | 3/2009 | Hong et al. | 257/72 |
| 7,795,740 B2 | 9/2010 | Yang et al. | |
| 7,888,789 B2* | 2/2011 | Sugaya et al. | 257/700 |
| 7,982,312 B2* | 7/2011 | Colburn et al. | 257/758 |
| 8,102,051 B2 | 1/2012 | Nakao | |
| 2003/0082913 A1 | 5/2003 | Danielson et al. | |
| 2005/0029664 A1 | 2/2005 | Cho et al. | |
| 2006/0145348 A1* | 7/2006 | Shimizu et al. | 257/758 |
| 2007/0205520 A1 | 9/2007 | Chou et al. | |
| 2007/0206631 A1 | 9/2007 | Parts et al. | |
| 2008/0067566 A1 | 3/2008 | Choi et al. | |
| 2008/0099921 A1 | 5/2008 | Katata | |
| 2008/0303160 A1 | 12/2008 | Colburn et al. | |
| 2009/0026616 A1 | 1/2009 | Dertinger et al. | |
| 2009/0273084 A1 | 11/2009 | Ayotte et al. | |
| 2009/0273086 A1 | 11/2009 | Bartsch et al. | |
| 2010/0117232 A1 | 5/2010 | Nakao | |
| 2010/0164109 A1 | 7/2010 | Chiou et al. | |
| 2011/0108986 A1 | 5/2011 | Lin et al. | |
| 2011/0140274 A1 | 6/2011 | Lee | |
| 2011/0215474 A1 | 9/2011 | Liu | |
| 2011/0233630 A1 | 9/2011 | Dertinger et al. | |
| 2011/0285022 A1 | 11/2011 | Lin et al. | |
| 2011/0316161 A1 | 12/2011 | Ohtake et al. | |
| 2012/0013010 A1 | 1/2012 | Kim | |
| 2013/0256892 A1* | 10/2013 | Yamazaki et al. | 257/751 |
| 2013/0277844 A1* | 10/2013 | Chiou et al. | 257/758 |

* cited by examiner

CONDUCTIVE LINES AND PADS AND METHOD OF MANUFACTURING THEREOF

This is a divisional application of U.S. application Ser. No. 12/836,151, entitled "Conductive Lines and Pads and Method of Manufacturing Thereof" which was filed on Jul. 14, 2010 and is incorporated herein by reference.

TECHNICAL FIELD

The present invention relates generally to a semiconductor device and method of manufacturing a semiconductor device and, in particular, to a method for forming conductive lines and pads in or on an insulating layer, and a semiconductor device comprising such conductive lines and pads.

BACKGROUND

A die is fabricated from a semiconductor wafer in several process steps. The front end of line (FEOL) process typically forms active areas and trenches into the semiconductor wafer. The back end of line process (BEOL) forms various metallization, via and insulating layers on the semiconductor wafer. An integrated circuit (IC) is manufactured by connecting semiconductor devices formed in the wafer via the metallization layers and via layers. Dies are formed by cutting the integrated circuits (IC) from the semiconductor wafer.

The dies are typically assembled in packages for use on a printed circuit board (PCB) as part of a larger circuit. Bonding pads on the die are typically bonded to leads or contact regions of the package. In some instances, the dies comprise bonding pads and metallization lines comprising different conductive materials.

SUMMARY OF THE INVENTION

In accordance with an embodiment of the present invention, a semiconductor device is disclosed. The semiconductor device includes a substrate having a first region and a second region and an insulating layer arranged on the substrate. A first conductive layer is arranged in or on insulating layer in the first region and a second conductive layer is arranged in or on the insulating layer in the second region. The first conductive layer comprises a first conductive material and the second conductive layer comprises a second conductive material wherein the first conductive material is different than the second conductive material. A metal layer is arranged on the first conductive layer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a semiconductor device and a method of forming thereof. The invention may also be applied, however, to other areas such as lithography mask manufacturing or printed circuit board (PCB) manufacturing.

In a typical arrangement, metallization lines and bond pads are formed in or on an inter-layer-dielectric (ILD) of a semiconductor device. The bond pads may provide areas for bonding the semiconductor device to other devices via bond wires.

The metal lines and the bond pads formed in or on the inter-layer-dielectric (ILD) of a semiconductor device can be ductile. Bonding these metal lines and bond pads with metal wires or other devices would damage these metal lines or bond pads and the underlying material arrangement including the electrically active devices. Therefore, in conventional manufacturing processes, it is common to place the bond pads in the periphery of semiconductor devices, where there is no mechanically sensitive layer stack underneath the bond pads. However, in order to enable bonding over active device areas technologically advanced manufacturing processes of metal lines and bond pads have mechanically stabilized the metal lines and bond pads by encasing the metal lines and bond pads with an additional metal layer or by stabilizing the metal lines and bond pads with a metal coating.

The semiconductor device may not only comprise metal lines and bond pads from one conductive material but also from other conductive materials. Conventional metal encasing or stabilizing technologies may form a mechanically stable metal layer on a first conductive material with adequate adhesion properties but at the same time may form a metal layer with poor adhesion properties on the second conductive material. In particular, the metal layer on the second conductive material may separate in smaller and larger flakes or pieces from the surface of the second conductive material in later process steps. The smaller and larger flakes or pieces from the instable metal layer may be distributed across the semiconductor device into electrically sensitive areas. As a result, these metal flakes or pieces may cause damage and electrical shortages and therefore decrease the yield of the production of these semiconductor devices.

Moreover, the yield may be further decreased by parasitic depositions of the metal layer on microscopic metallic particles left from previous processes. These microscopic metallic particles may be in particular a problem when they are found on top of the inter-layer-dielectric (ILD) between metal lines with narrow pitches.

Therefore, a process is needed that provides a mechanically stable metal layer on a first conductive material. Moreover, a process is needed that prevents deposition of the mechanically stable layer on a second conductive material. Furthermore, a process is needed that removes erratic contaminations on the semiconductor devices.

In one embodiment, a first meal line and/or bond pad may be arranged in or on an insulating layer and a second metal line and/or bond pad may be arranged in or on the insulating layer. A metal layer may be formed selectively on the first metal line and/or bond pad. In one embodiment the metal layer may be formed on the first metal line and/or bond pad but not on the second metal line and/or bond pad. In one embodiment the metal layer may be formed by a plating process. In one embodiment the metal layer may be formed by an electro less plating process (eLess). In one embodiment, plating may form a stable and reliable metal layer on a copper (Cu) line and/or bond pad and may not form a metal layer on an aluminum (Al) line and/or bond pad.

In one embodiment a first conductive line or layer and a second conductive line or layer is arranged above an insulating layer. In one embodiment a first conductive line or layer and a second conductive line or layer is arranged in an insulating layer. In one embodiment a first conductive line or layer, e.g. copper (Cu), is arranged in an insulating layer and a second conductive line or layer, e.g. aluminum (Al), is arranged above an insulating layer. In one embodiment, a second conductive line or layer, e.g. aluminum (Al), is arranged in an insulating layer and a first conductive line or layer, e.g. copper (Cu), is arranged above an insulating layer.

An advantage of embodiments of the present invention is a selective and reliable stabilization of conductive lines and/or pads of a semiconductor device. Another advantage of embodiments of the present invention is the prevention of a deposition of a metal having poor adhesion properties on the underlying conductive lines and/or pads. An advantage of embodiments of the present invention is an integration of a selective and reliable stabilization of conductive lines and/or pads and an in-situ clean process with no further complexity and cost. Yet another advantage of embodiments of the present invention is the availability of a large variety of protecting materials as capping material. A final advantage is a yield improvement in the semiconductor manufacturing process.

FIGS. 1 through 6 show cross-sectional views of a semiconductor device 100 at various stages of manufacturing in accordance with embodiments wherein the first conductive line or layer and the second conductive line or layer are arranged in or above an insulating layer.

Figure 1:
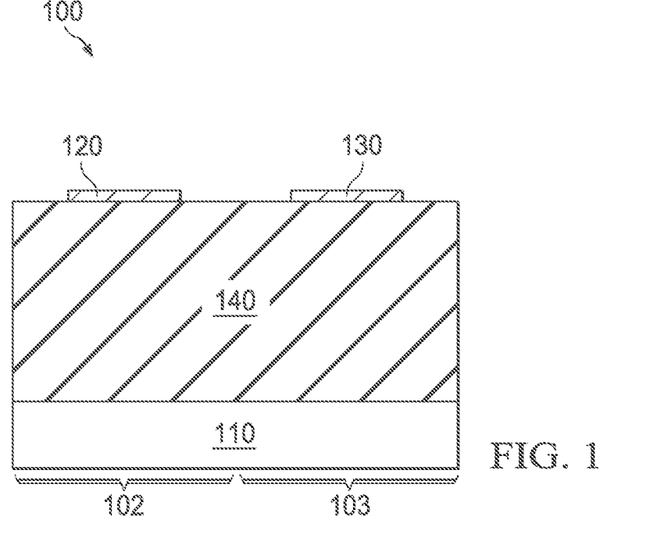
FIG. 1 shows a cross-sectional view of a first embodiment of a semiconductor device wherein a first and a second conductive layer is arranged on an insulating layer.

FIG. 1 shows a semiconductor device 100. The semiconductor device 100 comprises a substrate 110. The substrate 110 may comprise a semiconductor material such as silicon or germanium, a compound semiconductor material such silicon germanium, indium arsenide or gallium nitride, or any other suitable material. The substrate 110 may comprise active areas and isolation areas such as trenches. The substrate 110 may comprise active elements such as transistor or capacitors or passive elements such as resistors or filters. The substrate 110 may comprise integrated circuits, single transistors, logic elements or memory elements. The substrate 110 may comprise a single or a plurality of power transistors.

An insulating layer 140 may be arranged on the substrate 110. The insulating layer 140 may be an inter-layer-dielectric (ILD). The insulating layer or the inter-layer-dielectric (ILD) 140 may comprise a silicon oxide or a low-k material such as porous silicon, spin-on organic polymeric dielectrics or spin on silicon based polymeric dielectric. The inter-layer-dielectric (ILD) 140 may comprise conductive lines and vias. The conductive lines and vias may comprise aluminum or copper, or alternatively, other metals. The conductive lines and vias may be formed in the inter-layer-dielectric (ILD) 140 by a single damascene, a dual damascene process or an inverse patterning processes (deposition of metal film first, structure metal film and then fill trenches with ILD). The inter-layer-dielectric (ILD) 140 may comprise several interconnect levels. The interconnect levels may comprise conductive lines and via levels such as metal levels $M_1, M_2, \ldots, M_n$ and via levels $V_1, V_2, \ldots, V_{n-1}$. The higher level of conductive lines $M_i$ may be connected to lower levels of conductive lines $M_{i-1}$ by vias $V_i$ and the lowest level of conductive lines, $M_1$, may be electrically connected via plugs to contact areas arranged in active areas of the substrate 110, such as sources, drains, gates or capacitor plates, for example.

A first conductive layer 120 comprising a first conductive material may be arranged in a first region 102 of the semiconductor device 100 and a second conductive layer 130 comprising a second conductive material may be arranged in a second region 103 of the semiconductor device 100. The first conductive layer 120 and the second conductive layer 130 may comprise polysilicon, doped polysilicon, or a metal. Suitable metals are aluminum (Al), copper (Cu), tungsten (W), titanium (Ti), tantalum (Ta) or nickel (Ni), for example. Suitable metal alloys are tantalum nitride (TaN), titanium nitride (TiN), nickel platinum (NiPt), nickel rhodium (NiRh), nickel rhenium (NiRe), nickel silicide (NiSi), titanium silicide (TiSi), tungsten silicide ($WSi_x$), cobald silicide (CoSi), nickel platinum silicide (NiPtSi), nickel rhodium silicide (NiRhSi) or nickel rhenium silicide, for example. In one embodiment, the first conductive layer 120 may comprise copper (Cu) and the second conductive layer 130 may comprise aluminum (Al). In another embodiment, the first conductive layer 120 may comprise copper (Cu) but not aluminum (Al) and the second conductive layer 130 may comprise aluminum (Al) but not copper (Cu).

In one embodiment the first conductive layer 120 and the second conductive layer 130 may be arranged on top of the inter-layer-dielectric (ILD) 140. In another embodiment the first conductive layer 120 and the second conductive layer 130 may be arranged in the inter-layer-dielectric (ILD) 140. In one embodiment the first conductive layer 120 may be parallel to the second conductive layer 130. In another embodiment the first conductive layer 120 may be orthogonal to the second conductive layer 130 or, alternatively, may have any angle.

In one embodiment the last level of the conductive lines $M_n$ may comprise the first conductive layer 120. In one embodiment the first conductive layer 120 may comprise a bonding pad and the second conductive layer may comprise a test pad. In another embodiment the second conductive layer 130 may comprise a bond pad.

Figure 2:
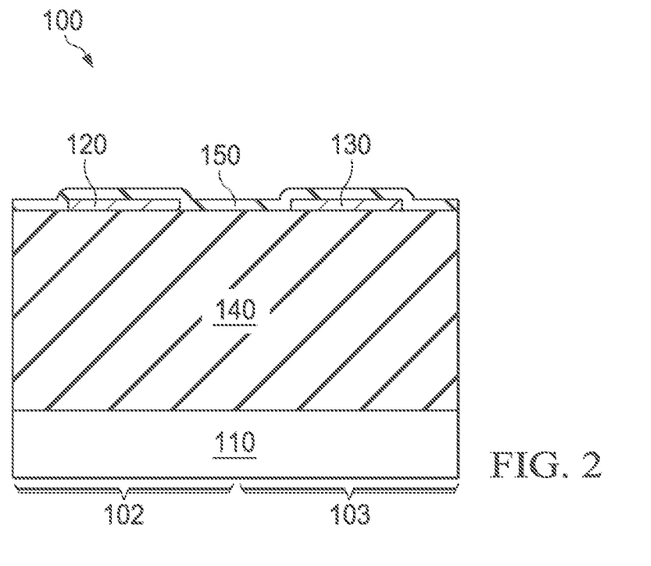
FIG. 2 shows a cross-sectional view of a first embodiment of a semiconductor device wherein a capping layer is formed on the insulating layer and the first and second conductive layers.

Referring now to FIG. 2, a capping layer 150 may be formed on the inter-layer-dielectric (ILD) 140. The capping layer 150 may be deposited over the inter-layer-dielectric (ILD) 140, the first conductive layer 120 and the second conductive layer 130. In one embodiment the capping layer 150 may comprise an insulating material, a dielectric material or a non-conductive material. In another embodiment, the capping layer 150 may comprise a silicon nitride (SiN), a silicon oxide (SiO), a silicon carbide (SiC), or a silicon on glass (SiOG). In yet another embodiment the capping layer 150 may comprise a high-k material such as hafnium silicate, hafnium oxide, zirconium silicate, or zirconium oxide, or a low-k material such as porous silicon, spin-on organic polymeric dielectrics or spin on silicon based polymeric dielectric. The capping layer 150 may be formed by a plasma enhanced chemical vapor deposition (PECVD), a low pressure chemical vapor deposition (LPCVD), a sub atmospheric chemical vapor deposition (SACVD), a physical vapor depositon (PVD), a SpinOnCoating process or a vacuum plasma spraying (VPS). The capping layer 150 may be about 20 nm to about 200 nm thick.

A layer of photoresist 160 is disposed on the capping layer 150 in the first and second regions 102, 103. In one embodiment, the photoresist type may be selected by requirements such as adhesion to the underlying capping layer 150 and minimum critical dimensions of the structures to be formed. For example, a positive photoresist or alternatively, a negative photoresist may be used. The photoresist layer 160 may be applied by a spin on coating process. The photoresist layer 160 may be about 2300 nm to about 4100 nm thick.

The layer of photoresist 160 is patterned using a conventional lithography processes. After exposure the photoresist 160 is developed. In an optional step, the surface of the layer of photoresist 160 may be solidified by an $O_2$ plasma treatment. The $O_2$ plasma treatment may strengthen the surface of the photoresist 160 for an application of a subsequent wet etch or dry etch process step. In one embodiment, the layer of photoresist 160 may be selectively removed.

Figure 3:
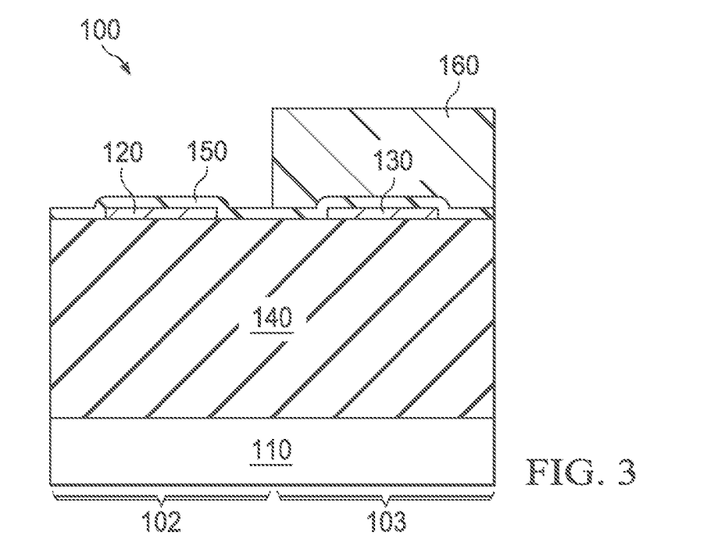
FIG. 3 shows a cross-sectional view of a first embodiment of a semiconductor device wherein a resist is disposed on a second region of the capping layer.

In one embodiment, the layer of photoresist 160 may be removed from the first region 102 but not from the second region 103. In one embodiment, the layer of photoresist 160 may be removed from the first region 102 and areas of the second region 103. In one embodiment, the photoresist 160 may be removed from all areas except from the second conductive layer 130 in the second region 103. This is shown in FIG. 3.

Figure 4:
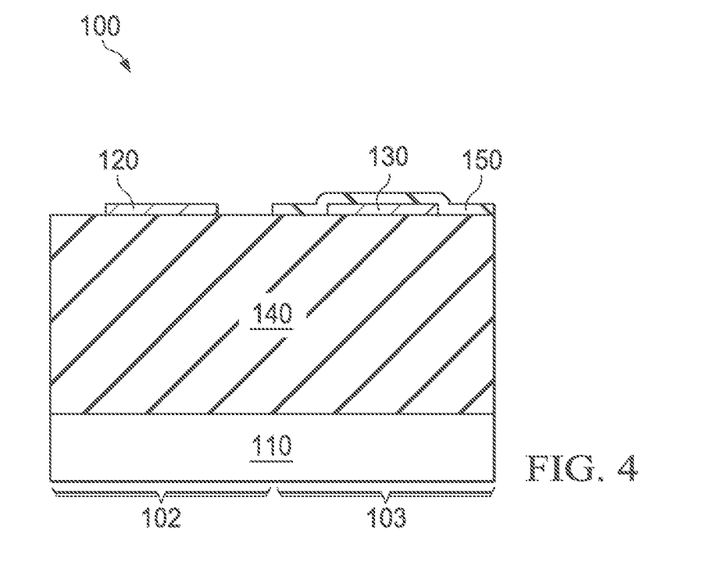
FIG. 4 shows a cross-sectional view of a first embodiment of a semiconductor device wherein the capping layer is removed from a first region.

Referring now to FIG. 4, in one embodiment the resist pattern 160 may be transferred on the capping layer 150 using a wet etch chemistry such as hydrogen fluoride diluted with $DIH_2O$ to a suitable concentration (e.g. 0.1% or 1%) or ammonium fluoride diluted with $DIH_2O$ to a suitable concentration. In one embodiment, the capping layer 150 is selectively removed using a dry etch such as reactive ion etching (RIE). In one embodiment, the capping layer 150 may be removed over the first region 102 exposing the first conductive layer 120. In one embodiment the capping layer 150 is removed over the first region 102 and areas of the second region 103. In one embodiment the capping layer 150 may be removed from all areas except from the area above the second conductive layer 130 in the second region 103. After the wet or dry etch step is finished, remaining parts of the layer of photoresist 160 may be removed thereby exposing the capping layer 150 in the second region 103 or in parts of the second region 103.

Figure 5:
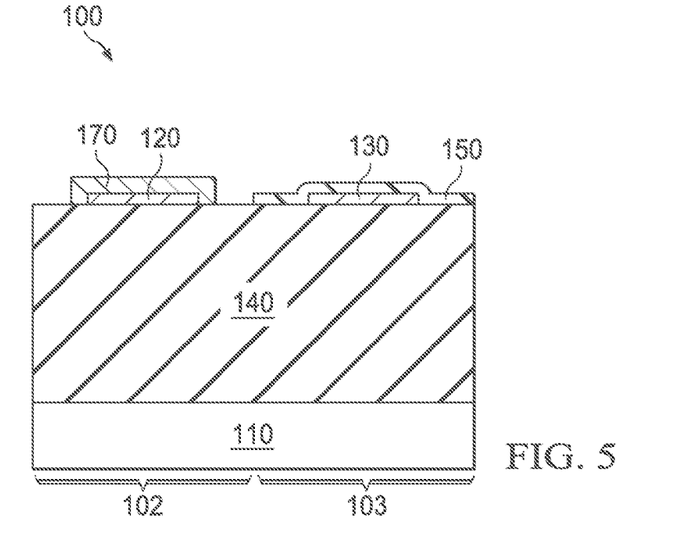
FIG. 5 shows a cross-sectional view of a first embodiment of a semiconductor device wherein a metal layer is disposed on the first conductive layer in the first region.

Referring now to FIG. 5, a metal layer 170 may be disposed on the first conductive layer 120 in the first region 102. The metal layer 170 may not be disposed on the second conductive layer 130 in the second region 103. In one embodiment the capping layer 150 may prevent the deposition of the metal layer 170 on the second conductive layer 130. In one embodiment, the metal layer 170 may be disposed on the first conductive layer 120 by a plating process. The plating process may not form a metal layer 170 on the inter-layer dielectric (ILD) 140.

In one embodiment, the metal layer 170 may be disposed by an electro-less (eLess) plating process. Electro-less plating, also known as chemical or auto-catalytic plating, is a non galvanic type of plating method that involves several simultaneous reactions in an aqueous solution, which occur without the use of external electrical power. The reaction is accomplished when hydrogen is released by a reducing agent and oxidized thus producing a negative charge on the surface of the underlying metal. Electro-less plating may deposit a metal layer 170 on conductive structures 120, 130 and not on the inter-layer-dielectric (ILD) 140. In one embodiment, the electro-less plating may deposit the metal layer 170 only on the conductive layer which is intended to receive the metal encasing or coating stack.

In one embodiment, the metal layer 170 may be formed by an electro-plating process. Electroplating is a plating process that uses electrical current to reduce cations of a desired material from a solution and coat a conductive layer with a thin layer of the material, such as a metal. In electroplating, an ionic metal is supplied with electrons to form a non-ionic coating on a metal layer. A common system may involve a chemical solution with the ionic form of the metal, an anode (positively charged) which may consist of the metal being plated (a soluble anode) or an insoluble anode (usually carbon, platinum, titanium, lead, or steel), and finally, a cathode (negatively charged) where electrons are supplied to produce a film of non-ionic metal.

The metal layer 170 may comprise a single metal or a metal layer stack. In one embodiment nickel (Ni), chromium (Cr), palladium (Pd), gold (Au), cobalt (Co), platinum (Pt), silver (Ag) or copper (Cu) plating alloys may be used as plating materials. In one embodiment the metal layer 170 may comprise a metal layer stack such as nickel (Ni)-molybdenum (Mo)-phosphor (P), nickel phosphor (NiP), cobald tungsten phosphor (CoWP), nickel boron (NiB) or palladium copper (PdCu). In one embodiment the metal layer stack may comprise alloys of these materials. The selection of a single metal or a metal layer stack for metal layer 170 may depend on the desired film properties. In one embodiment the metal layer 170 may comprise NiMoP and an additional layer such as palladium (Pd), chromium (Cr), gold (Au), zinc (Zn), platinum (Pt), or tin (Sn).

A metal or metal layer stack could range from a couple of nanometers to several microns for each layer depending on the specific application and the desired film properties. Film stress or surface conditions may vary with film thickness. In a practical application providing mechanical stability to a subjacent ductile layer the film thicknesses for NiMoP may vary in a range of about 1200 nm to about 2200 nm. Palladium (Pd) thicknesses have proven to be effective in a range from about 100 nm to about 600 nm. Gold (Au)-thicknesses plated from a cyanidic source chemistry usually show self-limited deposition behavior and create layer thicknesses in between about 10 nm and about 50 nm.

Electroless plating chemistry generally contains rare and noble metal salts. Therefore manufacturing costs for electroless plating processes may be higher in comparison to conventional deposition processes. In one embodiment the NiMoP-thickness for providing mechanical stability may be about 1300 nm, the Pd-thickness on top for optimizing the electrical contact resistance may be about 300 nm and the Au-film thickness for preventing oxidation of the underlying Pd may be about 20 nm.

Figure 6:
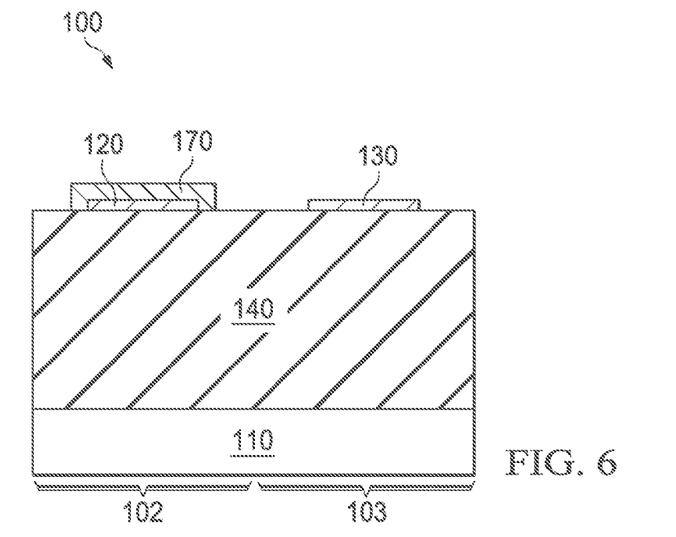
FIG. 6 shows a cross-sectional view of a first embodiment of a semiconductor device wherein the capping layer is removed from the second region.

After the deposition of the metal layer 170 is finished, the capping layer 150 may be completely removed from the semiconductor device 100 by a wet etch process or an ash-process. The optional complete removal of the capping layer 150 may expose the insulating layer or inter-layer dielectric (ILD) 140 and the second conductive layer 130. The removal of the capping layer 150 on the second conductive layer 130 may expose the aluminum (Al) material of the second conductive layer 130. This is shown in FIG. 6.

While embodiments of the invention have not been described in detail with regards to the first conductive line or layer and second conductive line or layer being arranged in the insulating layer or the inter-layer-dielectric (ILD), a person skilled in the art would known how to arrange and process these conductive lines arranged in the insulating layer.

FIGS. 7 through 11 show cross-sectional views of a semiconductor device 200 at various stages of manufacturing in accordance with an embodiment, wherein one of the first conductive line or the second conductive line is arranged in the insulating layer and wherein one of the first conductive line or the second conductive line is arranged above the insulting layer.

Like numerals are used for the various elements that were described in FIGS. 1 through 6. To avoid repetition, each reference number shown in FIGS. 7 through 11 is not described in detail herein. Rather, similar materials x10, x20, x30, etc. are use for the various materials and material layers shown in FIGS. 1 through 6.

Figure 7:
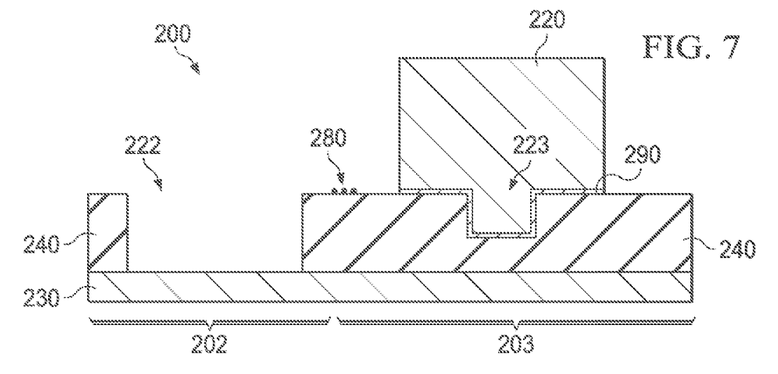
FIG. 7 shows a cross-sectional view of a second embodiment of a semiconductor device having an first conductive layer arranged on an insulating layer and a second conductive layer arranged in the insulating layer.

FIG. 7 shows as a semiconductor device 200. The semiconductor device 200 comprises a second conductive layer 230 arranged in an insulating layer or an inter-layer-dielectric (ILD) 240. The insulating layer or the inter-layer-dielectric (ILD) 240 may comprise a first opening 222 in a first region 202. The first opening 222 in the first region 202 exposes a region of the second conductive layer 230. The semiconductor device 200 comprises a first conductive layer 220 arranged on top of the insulating layer or the inter-layer-dielectric (ILD) 240. The first conductive layer 220 is electrically isolated from the second conductive layer 230.

In one embodiment the first conductive layer 220 may be partially arranged in the insulating layer or inter-layer-dielectric (ILD) 240. The lower part of the first conductive layer 240 may be arranged in a second opening 223 in the insulating layer or inter-layer-dielectric (ILD) 240. The second opening 223 may be arranged in the second region 203. The second opening 223 may be lined with a liner 290 and maybe filled with a first conductive layer including a first conductive material 220. The liner 290 may comprise a barrier liner, such as a titan nitride (TiN) or tantalum nitride (TaN) liner, for example. Alternatively, the liner 290 may comprise titanium (Ti), tungsten (W), titanium silicon nitride (TiSiN) or titanium tungsten (TiW). In one embodiment perovskite materials such as $LaCrO_3$ or $LaMnO_3$ may be used as a liner material.

In one embodiment, the first conductive layer 220 comprises a metallization layer $M_n$ arranged on the upper surface. The first conductive layer 220 may comprise copper (Cu) or aluminum (Al) or any other suitable metal. In one embodiment the second conductive layer 230 may be a metal layer and may seal the semiconductor device 200 from electrostatic discharge (ESD) or other undesired contaminations. In one embodiment the metal layer 230 may not provide any electrical connection functionality for the semiconductor devices in the substrate. In one embodiment the second conductive layer 230 may comprise copper (Cu) or aluminum (Al) or any other suitable metal but the second conductive layer 230 may be a different material than the first conductive layer 220.

In one embodiment the first conductive layer 220 may comprise copper (Cu) and the second conductive layer 230 may comprise aluminum (Al). The opening 222 may expose a region of the second conductive layer 230. The opening 222 exposing the region of the second layer 230 may form test pads. In one embodiment the test pads may form a hexagon or a rectangular shape. In another embodiment the test pads may form a square or any other suitable shape. In one embodiment the copper layer may form bond pads. In one embodiment the pads may form a hexagon. In another embodiment the pads may form a square or have a rectangular shape or any other suitable shape.

In one embodiment the first conductive layer 220 may be parallel to the second conductive layer 230. In another embodiment the first conductive layer 220 may be orthogonal to the second conductive layer 230 or, alternatively, may have any angle.

A contamination 280 may be found on the semiconductor device 200. The contamination may be a deposition of materials from previous process steps. In one embodiment, the contamination 280 may be found on the surface of the insulating layer or inter-metal-dielectric-layer (ILD) 240. The contamination material may be a metal, a semiconductor material or an insulating material.

Figure 8:
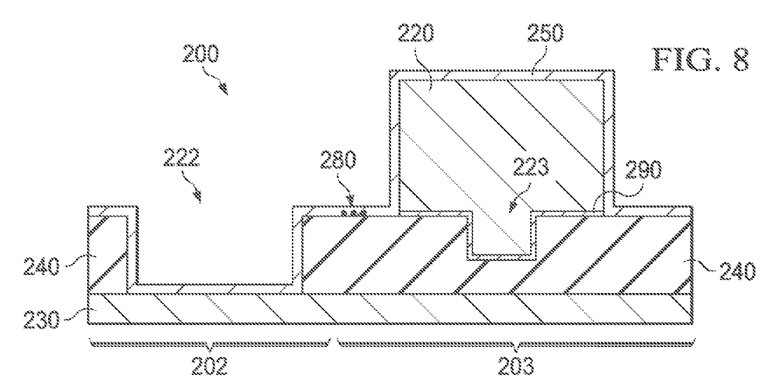
FIG. 8 shows a cross-sectional view of a second embodiment of a semiconductor device wherein a capping layer is disposed over the insulating layer and the first and second conductive layers.

As can be seen in FIG. 8, a capping layer 250 may be formed over the first and second regions 202, 203 of the semiconductor device 200. The capping layer 250 may be formed over the insulating layer or inter-layer-dielectric (ILD) 240, the first conductive layer 220 and the second conductive layer 230 exposed by the opening 222, and along the sidewalls of the opening 222.

The capping layer 250 may be formed over the contamination 280. In one embodiment, the capping layer 250 may completely cover the contamination 280. In another embodiment, the capping layer 250 may partially cover the contamination 280.

Figure 9:
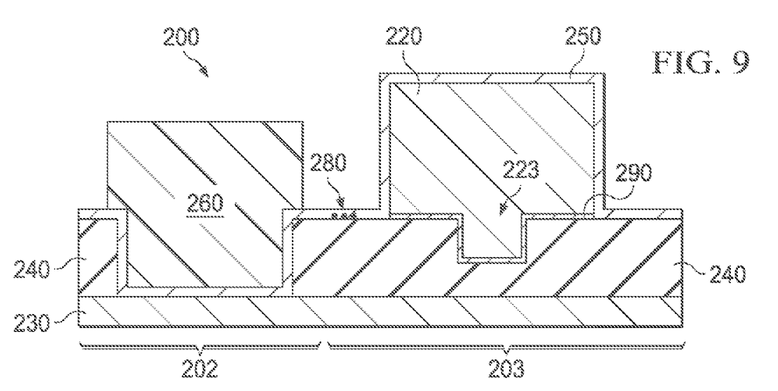
FIG. 9 shows a cross-sectional view of a second embodiment of a semiconductor device wherein a resist is disposed over the opening in a first region.

Referring now to FIG. 9, a layer of photoresist 260 may be formed over the semiconductor device 200 in the first and second regions 202, 203. The layer of photoresist 260 may be structured and patterned using a conventional lithography process. In one embodiment, the layer of photoresist 260 is removed from the second region 203 but not from the first region 202. In one embodiment, the layer of photoresist 260 may be removed from the second region 203 and areas of the first region 202. In one embodiment the layer of photoresist 260 may at least remain in the trench 222 covering the region of the second conductive layer 230 and the capping layer 250. In one embodiment the layer of photoresist 260 may remain on the bottom and the sidewalls of trench 222 over the capping layer 250. In one embodiment, the photoresist 260 may only be removed from the first conductive layer 220 in the second region 203.

The resist pattern is then transferred on the capping layer 250 by a wet or a dry etch. Depending on the pattern of the photoresist, the capping layer may only remain in areas where the photoresist layer 260 has not been removed.

The wet or dry etch may remove the contamination 280. In one embodiment the capping layer 250 and the contamination 280 may be removed at the same time. The removal of the contamination 280 may be achieved and controlled by an amount of over-etch time. In one embodiment the capping layer 250 is over-etched by about 50% to about 150%. In one embodiment the capping layer is over-etched by an amount of about 80% to about 120%. In one embodiment the capping layer 250 is over-etched by an amount of about 100%. In one embodiment the contamination is completely removed.

Figure 10:
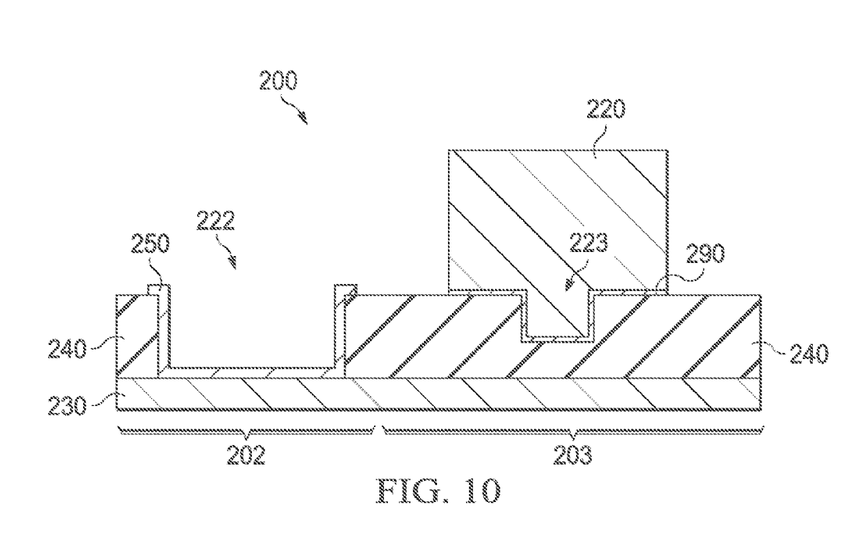
FIG. 10 shows a cross-sectional view of a second embodiment of a semiconductor device wherein the capping layer is partially removed.

After the over-etch is finished, the remaining photoresist 260 may be removed thereby exposing the capping layer 250 originally protected by the photoresist 260. In one embodiment, the capping layer 250 may remain in the first region 202. In one embodiment the capping layer 250 may remain in the trench 222 covering the exposed region of the second conductive layer 230. In one embodiment the capping layer 250 may remain in the trench 222 covering the exposed region of the second conductive layer 230 and the sidewalls of the trench 222. In one embodiment, the capping layer 250 may remain on the insulating layer or inter-layer-dielectric (ILD) 240 except on the first conductive layer 220. In one embodiment the capping layer 250 may remain on the aluminum material. In one embodiment, the capping layer 250 may remain in areas where plating a metal layer is not desired. This is shown in FIG. 10.

Figure 11:
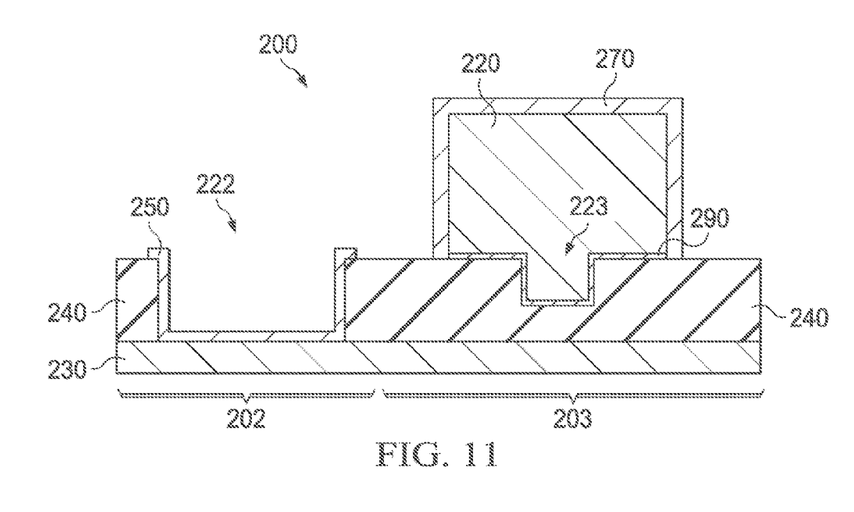
FIG. 11 shows a cross-sectional view of a second embodiment of a semiconductor device wherein a metal layer is formed over the first conductive layer on the insulating layer.

FIG. 11 shows the semiconductor device 200 after a metal layer 270 is formed on the first conductive layer 220. In one embodiment the metal layer may only be formed over the first conductive layer 220. In one embodiment the metal layer 270 may be formed by a plating process. In one embodiment the metal layer 270 may be formed by an electroless plating process. In another embodiment the metal layer 270 is formed by electro plating process. In one embodiment the metal layer 270 is a layer stack comprising nickel (Ni)-molybdenum (Mo)-phosphor (P) on copper (Cu). In one embodiment the metal 270 is a layer stack comprising NiMoP and palladium (Pd) on copper (Cu). In another embodiment the meal layer 270 comprises nickel phosphor (NiP) and palladium (Pd) on copper (Cu). In yet another embodiment the metal 270 may comprise nickel phosphor (NiP) and palladium (Pd) on aluminum (Al).

In one embodiment, a metal layer 270 may not be formed on the contamination 280 because the capping layer 250 has either covered the contamination 280 or the capping layer 250 and the contamination 280 have been removed before the formation of the metal layer 270.

While embodiments of the invention have not been described in detail with regards to the first conductive layer 220 arranged in the insulating layer or inter-layer-dielectric (ILD) 240 and the second conductive layer 230 on top of the insulating layer or inter-layer-dielectric (ILD) 240, a person skilled in the art would know how to arrange these layers accordingly. Moreover, while embodiments of the invention have not been described in detail with regards to encasing a conductive layer arranged in the insulating layer, a person skilled in the art would know how to deposit a metal layer 270 on a conductive layer arranged in the insulating layer or inter-layer-dielectric (ILD) 240.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device comprising:
   a substrate comprising a first region and a second region;
   an insulating layer disposed on the substrate;
   a first conductive layer disposed on the insulating layer in the first region and a second conductive layer disposed on the insulating layer in the second region, wherein the first conductive layer comprises a first conductive material and the second conductive layer comprises a second conductive material and wherein the first conductive material is a different material than the second conductive material, wherein a first major surface of the first conductive layer and a first major surface of the second conductive layer are co-planar and disposed on a major surface of the insulating layer; and
   a metal layer plated on the first conductive layer.

2. The semiconductor device according to claim 1, wherein the metal layer is disposed directly on the first conductive layer.

3. The semiconductor device according to claim 1, wherein the metal layer comprises a layer stack comprising NiMoP, NiP, CoWP, NiB, or PdCu.

4. The semiconductor device according to claim 1, wherein the first conductive material is copper (Cu) and the second conductive material is aluminum (Al), or wherein first conductive material is aluminum (Al) and the second conductive material is copper (Cu).

5. The semiconductor device according to claim 1, wherein the first conductive layer comprises a first pad and the second conductive layer comprises a second pad.

6. The semiconductor device according to claim 1, further comprising a capping layer disposed in an area outside the first conductive layer.

7. The semiconductor device according to claim 6, wherein the capping layer comprises a silicon nitride, a silicon oxide, a silicon carbide, a silicon-on-glass (SiOG), a high-k material, or a low-k material.

8. The semiconductor device according to claim 6, wherein the capping layer is only disposed on the second conductive layer.

9. The semiconductor device according to claim 1, wherein the insulating material comprises an inter-layer-dielectric (ILD).

* * * * *